US008542848B1

(12) United States Patent
Krutsick

(10) Patent No.: US 8,542,848 B1
(45) Date of Patent: Sep. 24, 2013

(54) MUSICAL INSTRUMENT PREAMPLIFIER

(76) Inventor: Thomas Joseph Krutsick, Fleetwood, PA (US)

( * ) Notice: Subject to any disclaimer, the term of this patent is extended or adjusted under 35 U.S.C. 154(b) by 1259 days.

(21) Appl. No.: 12/189,190

(22) Filed: Aug. 10, 2008

Related U.S. Application Data

(60) Provisional application No. 60/964,494, filed on Aug. 13, 2007.

(51) Int. Cl.
*G10H 1/00* (2006.01)
*H03G 3/00* (2006.01)

(52) U.S. Cl.
USPC .............. 381/118; 381/120; 330/127; 330/70

(58) Field of Classification Search
USPC ............................ 381/118, 120; 330/127, 70
See application file for complete search history.

(56) References Cited

U.S. PATENT DOCUMENTS

| | | | | |
|---|---|---|---|---|
| 3,194,870 | A * | 7/1965 | Tondreau et al. | 84/726 |
| 3,357,291 | A * | 12/1967 | Carmichael | 84/267 |
| 3,696,700 | A * | 10/1972 | Berardi | 84/291 |
| 3,781,451 | A * | 12/1973 | Nolan | 84/723 |
| 4,211,893 | A * | 7/1980 | Smith | 381/118 |
| 5,546,046 | A * | 8/1996 | Trentino | 330/127 |
| 5,647,004 | A * | 7/1997 | Sondermeyer et al. | 381/61 |
| 5,693,898 | A * | 12/1997 | Fishman | 84/267 |
| 6,140,870 | A * | 10/2000 | Cook | 330/3 |
| 6,723,908 | B2 * | 4/2004 | Chapman et al. | 84/453 |
| 2004/0074380 | A1 * | 4/2004 | Fishman | 84/741 |
| 2004/0100324 | A1 * | 5/2004 | Fryette | 330/127 |
| 2005/0045027 | A1 * | 3/2005 | Celi et al. | 84/723 |
| 2006/0008097 | A1 * | 1/2006 | Stenberg et al. | 381/113 |
| 2006/0012423 | A1 * | 1/2006 | Smith | 330/118 |
| 2006/0140419 | A1 * | 6/2006 | Timberlake, Jr. | 381/102 |
| 2007/0160220 | A1 * | 7/2007 | Latshaw | 381/28 |
| 2008/0037806 | A1 * | 2/2008 | Schatten | 381/118 |

OTHER PUBLICATIONS

"Takamine Cool Tube Review," Jan. 2006, Sound on Sound Magazine, pp. 1.*
Takamine Cool Tube Specifications, printed Mar. 13, 2012 from http://www.takamine.com/electronics/cool_tube_preamp, pp. 1-4.*

* cited by examiner

*Primary Examiner* — Steven J Fulk

(57) ABSTRACT

The present invention provides embodiments of a musical instrument preamplifier. It is especially suited to acoustic and electric guitars and basses. All components, including the power source, are contained within or on the body of the instrument. The preamplifier dubbed BPTD (for Battery Powered Tube Driver) contains a vacuum tube input stage and may utilize a second stage consisting of either a vacuum tube or semiconductor device, such as a JFET. Circuitry is included to bias the cathode heater and the preamplifier circuit with no dangerous high voltages present. The tube may be mounted on the instrument body to provide for a pleasing display.

1 Claim, 6 Drawing Sheets

MUSICAL INSTRUMENT PREAMPLIFIER

BACKGROUND OF THE DISCLOSURE

1. Technical Field

The present invention relates to the field of electronic amplification of musical instruments. More particularly, the present invention relates to the use of battery driven vacuum tubes contained within or attached physically to the musical instrument; typically, but not limited to, a guitar or bass guitar.

2. Description of the Related Art

A In the paper "Tubes Versus Transistors—Is There an Audible Difference", Russell O. Hamm makes the case for tube amplification because such an amplifier can be operated in the overload region without adding objectionable distortion. Vacuum tube amplifiers are regarded highly by musicians, for the characteristic tone they produce.

The power supplies in these amplifiers are generally dangerous because of the high operating potentials. The components are often large, heavy, and expensive. They also require a separate lower voltage filament heater. A musician may utilize a stand-alone tube preamplifier coupled with either a tube, solid-state or hybrid power amplifier (part tube and part solid-state), utilizing the preamplifier to 'color' the sound. The preamplifier does not have to support the high volume levels of the power amplifier and can give a musician acceptable tone over for use with a range of power amplifiers.

Preamplifiers may be built into the instrument (i.e. on-board preamp), and are typically used in electric or so-called electric-acoustic guitars and basses; but are composed of solid-state semiconductors, and utilize amplifying devices such as transistors and operational amplifiers (i.e. op-amps).

It would be an improvement in the prior art to develop a battery powered tube preamplifier contained within the instrument (i.e. on-board preamp). In this case the battery must supply both the heater filament and safe tube operating voltage for a length of time of at least a typical performance. The few cases of prior art that attempt to utilize low voltage tube circuitry present these units as a stand alone preamplifier or amplifier, supplied from a conventional AC supply.

SUMMARY OF THE INVENTION

The present invention utilizes a tube or tube-hybrid (e.g. tube-JFET) preamplifier contained within the musical instrument, typically an electric guitar or bass, to provide amplification whilst preserving the pleasing harmonics and soft compression of the vacuum tube. The present invention incorporates a DC supply also within the confines of the instrument, which supplies the heater elements of the tube or tubes and the audio circuit voltage supply.

The primary objective of this on-board battery powered tube preamplifier, hereinafter-called BPTD (for battery powered tube driver) is to provide a transducer interface to an amplifier while incorporating a device that produces low order harmonics when overdriven. Said transducer may be a microphone, electromagnetic pickup(s), piezoelectric pickup(s), or an electronic circuit. Vacuum tubes produce lower order harmonics where each subsequent higher frequency harmonic is lower in level than the previous one. This characteristic is most relevant to the input stage that connects directly to the transducer.

A second objective is to utilize an on-board DC source capable of providing both the heater supply for the tube as well as the audio circuit. This may be accomplished with a transformer, voltage doubler stages, charge pump circuitry, or a battery like source. This power supply should last long enough for a typical performance.

A third objective is to disregard the standard practice of utilizing negative feedback to reduce distortion. Instead a zero feedback approach available to tube amplifier design is used to enhance the native response of the vacuum tube. The popular approach of using operational amplifier integrated circuits, which sound sterile and not musical, is avoided.

A fourth objective is to provide a large voltage overhead for transient response of the transducers.

A fifth objective is to provide for driving the typical high impedance power amplifier input without the need for a high current solid-state device.

A sixth objective is to incorporate a solid-state device in a final stage of the preamp when current driving capability is needed.

A seventh objective is to allow the vacuum tube to be easily changed to various common types including the 12AX7, 12AU7, 12AY7, ECC83, and the other replacements which differ in gain and other characteristics, creating different tonal characteristics (i.e. coloring).

An eighth objective is to allow the low voltage operating tube to be displayed in a recess, cavity or hole in the instrument body, which may or may not be covered by translucent or screen material. In the case of a guitar or bass, this may or may not be the pick guard.

Described generally, the BPTD comprises a vacuum tube having at least one grid for receiving an input signal, a plate run at low voltage for delivering a plate voltage responsive to the input signal at the gate, and a cathode connected through a resistance or shorted to ground. The BPTD may also comprise a tone control section, incorporating passive filters or active circuitry. In addition it may incorporate a solid-state gain stage (e.g. self biasing JFET) for driving a load when needed. The BPTD may utilize one or both halves of a twin triode tube such as the 12AX7 family of tubes. All electronics are supplied with an on-board battery. A switch is incorporated in the ¼" phone jack (typical musical instrument audio interface) to disable the circuit when not in use. The BPTD in one embodiment utilizes no feedback and is non-inverting. The vacuum tube is mounted in a pleasing manner on the body of the instrument. There are various other devices to support the BPTD circuit like load resistors, coupling capacitors, bias resistors, filter networks, transformers, solid state-devices and integrated circuits, which follow standard practices from prior art.

BRIEF DESCRIPTION OF THE DRAWINGS

The disclosed subject matter may be understood by reference to the following description taken in conjunction with the accompanying drawings, in which like reference numerals identify like elements, and in which.

Figure 1:
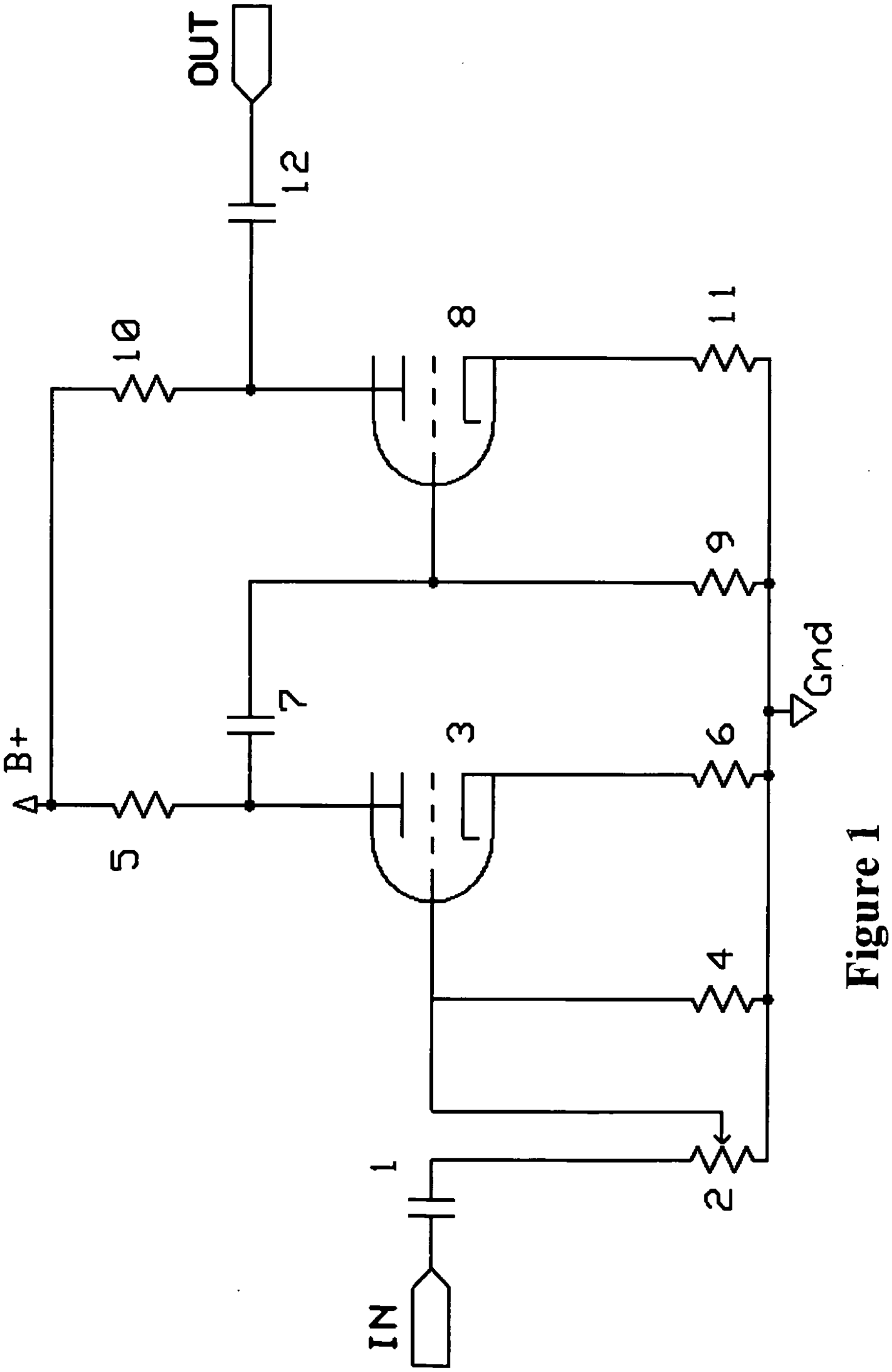
FIG. 1 is an electrical schematic of one embodiment of a two stage battery driven tube musical instrument preamplifier.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the scope of the appended claims.

DETAILED DESCRIPTION OF SPECIFIC EMBODIMENTS

Illustrative embodiments are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The disclosed subject matter will now be described with reference to the attached figures. Various structures and devices are schematically depicted in the drawings for purposes of explanation only and so as to not obscure the present invention with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is a battery powered tube preamplifier contained completely within or attached to the musical instrument, typically being an electric or electric-acoustic guitar or bass guitar. Although specific embodiments of the present invention will be described with reference to the drawings, it should be understood that such embodiments are by way of example only and merely illustrative of but a small number of the many possible specific embodiments which can represent applications of the principles of the present invention.

FIG. 1 shows one embodiment of the tube amplifier. The input is the signal from the switched electromagnetic pickups. The input port may be connected to a DC blocking, AC coupling capacitor 1 which holds a grid bias charge, or optionally, directly connect to a variable resistor 2. The variable resistance pin of the potentiometer 2 connects to the grid of the vacuum tube 3 and also a grid bias resistor 4. The input should arrive at the vacuum tube before going through any amplifying device for best performance. Note that the tube is comprised of two triodes 3 and 8 in one package.

The vacuum tube may be a 12AX7, 12AY7, 12AT7, 12AU7 or any of the other compatible versions. All differ in gain and tonal characteristics and should be selected to give the wanted output. These are twin triodes, with two tubes in one package allowing for two stages of gain as in this embodiment or two channels each with one stage of tube amplification.

Other versions of audio amplifier tubes may be used provided they can be operated at low voltages and the requirement for the filament heater is supportable by a battery supply. The cathode of ½ of the tube is connected to a resistor 6. It may also be connected by a bypass capacitor, or the resistance value may be set to 0 Ohms resulting in the cathode being shorted to ground as in one embodiment. The plate of the tube is connected to a resistor 5 and a blocking capacitor 7, which passes the AC signal to the next stage. The other end of the resistor 5 is connected to a low voltage supply of about 30 volts DC. The coupling capacitor 7 is connected to the grid of the second half of the tube 8, which is also connected to a grid bias resistor 9. The cathode of triode 8 is connected to ground by resistor 11. A bypass capacitor may be included along with the resistor, or the resistor value may be 0 Ohms as before indicating a direct short to ground. The plate of the tube 8, is connected by resistor 10 to the low voltage power supply of 30 volts. It is also connected to a bypass capacitor 12. This bypass capacitor couples the AC signal to the tone control circuitry.

Figure 2:
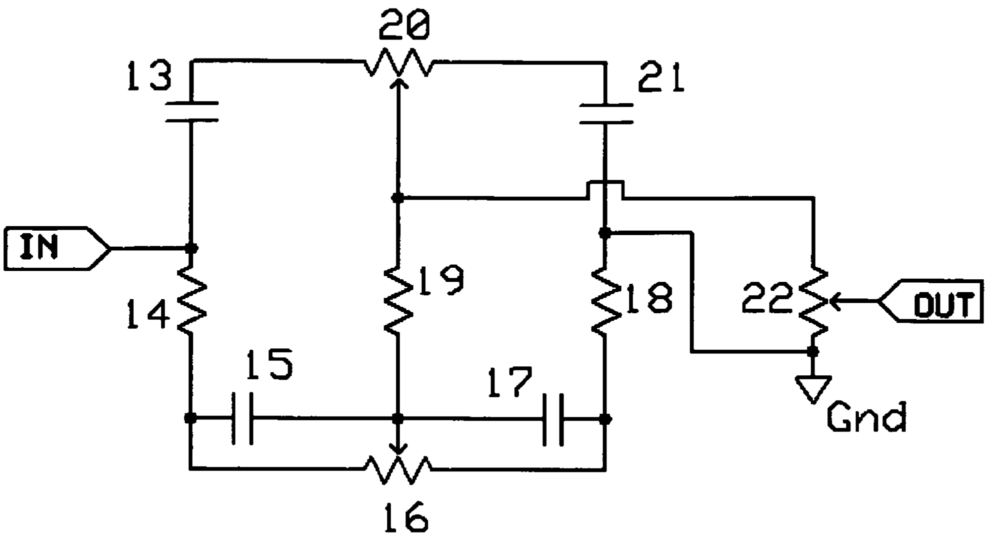
FIG. 2 is an electrical schematic diagram of one embodiment of the tone control section of the battery driven tube musical amplifier.
Figure 3:
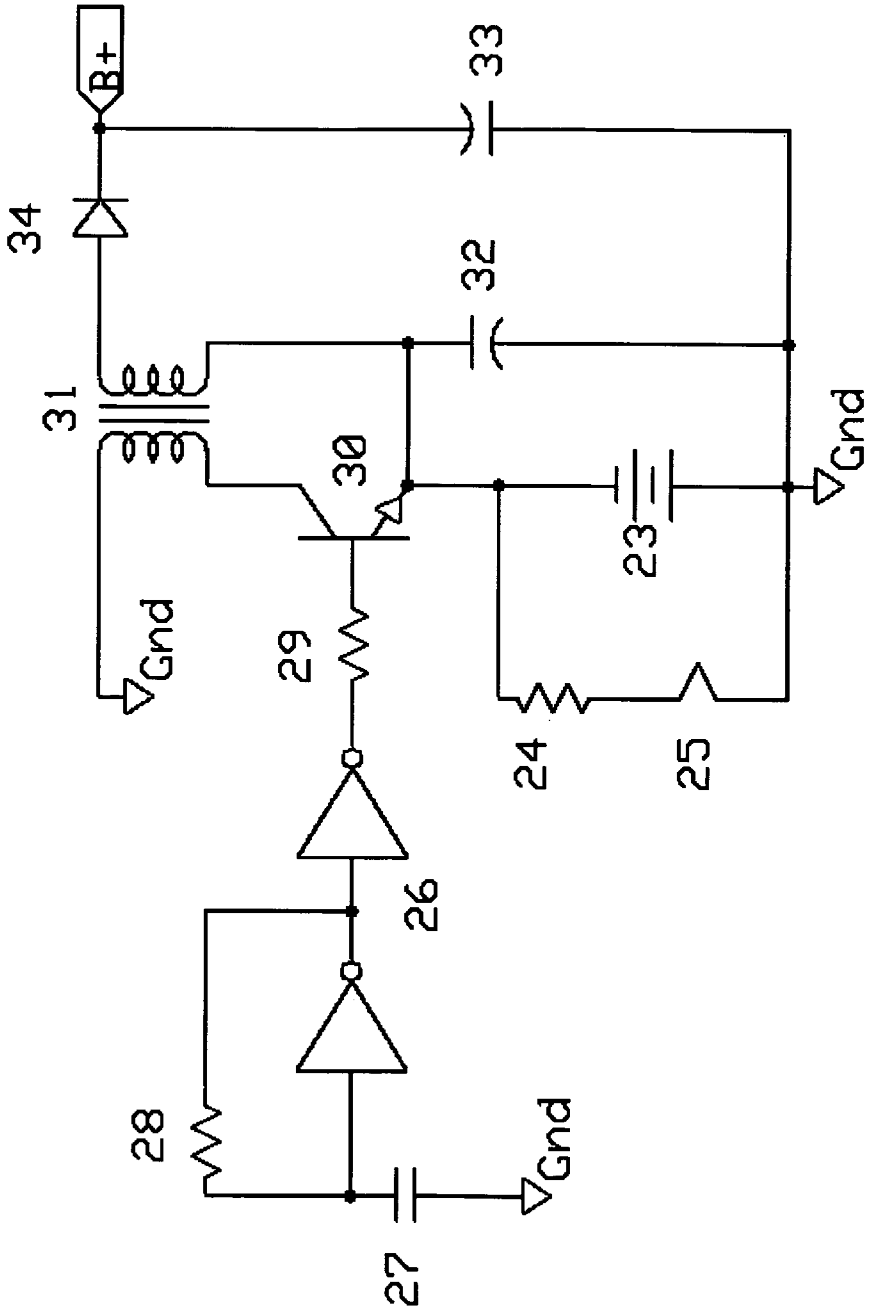
FIG. 3 is an electrical schematic diagram of one embodiment of the power supply section of the battery driven tube musical amplifier

FIG. 2 shows one embodiment of the tone control circuitry. Although active devices may be used, in this embodiment the tone control consists of passive filters designed to color the sound. The tone section may occur anywhere in the signal flow, and in fact, if may be hard to decouple the tone shaping circuitry from the preamplifier in some embodiments. In this embodiment the output from the previous amplifier (FIG. 1) is connected to a capacitor 13 and a resistor 14. The resistor is connected to a filter capacitor 15 and a variable resistor 16, which provides bass control. The capacitor 15 connects to the wiper of the variable resistor 16, filter capacitor 17 and resistor 19. Filter cap 17 then connects to the variable resistor 16 and resistor 18, which then connects to the circuit ground. Resistor 19 connects to the wiper of variable resistor 20, which provides treble control, and may connect to a bypass capacitor before connecting to one side of variable resistor 22, which provides overall volume control. The other side of variable resistor 22 goes to circuit ground. One end of variable resistor 20 goes to circuit ground through filter capacitor 21. The other end connects back to capacitor 13. The wiper of variable resistor 22 would typically be connected to a ¼ inch phone jack in this embodiment. The phone jack may incorporate a switch, so that when the guitar is unplugged, circuit power remains off. On/Off function may also be incorporated by utilizing a stereo ¼" phone jack. Plugging in a monophonic ¼ " plug would then serve to short the ring to the sleeve, comprising s simple mechanical switch. The output may also go to an RCA, XLR, or other jack.

The DC source of this invention may be a battery, fuel cell, or some other supply. The power supply circuit must be able to provide a low voltage to the tube heater element and a higher voltage, of 20 to 60 V to the audio circuit. In this embodiment about 30 volts is used and considered a safe voltage, as opposed to traditional tube circuitry, which can operate in excess of several hundred volts. The power supply circuit would consist of a charge pump, voltage-doubler stage(s), miniature transformer, or a voltage multiplier in some embodiments. These circuits are well known in the industry, and may include commercially available integrated circuits. One embodiment utilizes 4 AA cells to provide power, however a higher voltage battery pack may also be used, provided there is room in the body of the instrument. Typically these circuits utilize an oscillating circuit (e.g. timer, multi-vibrator, Schmidt trigger, etc. . . . ) in producing the higher voltage. The oscillator frequency should be set well above the audio bandwidth. The lower voltage usually utilized for the heater element may be obtained from the same means as described above, however proper selection of the battery may allow direct powering of the tube heater.

Figure 4:
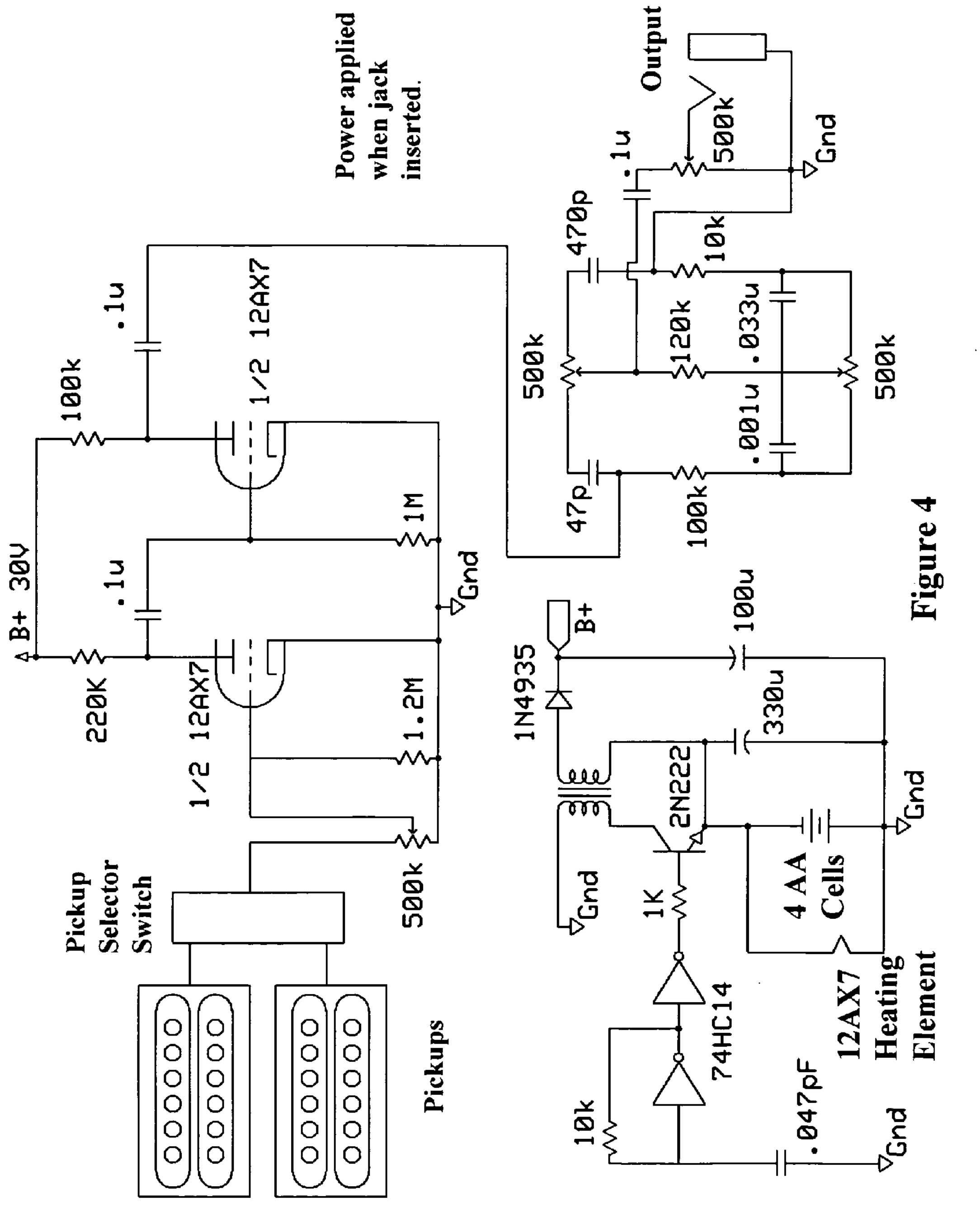
FIG. 4 is the complete electrical schematic of one embodiment of the battery driven musical instrument preamplifier used in the prototype of an electric guitar.

One embodiment of the power supply circuit is shown in FIG. 4. In this embodiment 4 AA rechargeable cells 23 were chosen. These are connected to the paralleled heater elements 25 of the twin triode tube through resistor 24 which may have a value of 0 Ohms and become a short to ground. For the tube used, the filament was somewhat starved, but functioned well. Because of parts on hand, a Schmidt trigger 26 was used to provide the pulse train. The frequency of the oscillator is controlled by resistor 28 and capacitor 27. The output of the oscillator connects to resistor 29, which then connects to the base of the npn bipolar transistor 30. The collector of said transistor is tied to one winding of transformer 31. The other end of that winding is tied to circuit ground. The emitter of transistor 30 is tied to the negative side of the battery cells 23. The positive side of the battery pack is tied to circuit ground. The emitter of transistor 30 is also tied to ground through electrolytic capacitor 32, and the second winding of transformer 31. The other side of this winding is connected to the anode of diode 34. The cathode of diode 34 is connected to ground through the positive terminal of electrolytic capacitor 33. The 30-volt supply is taken from the cathode side of diode 34. Care must be taken to properly orient connections to the electrolytic capacitors and the transformer.

FIG. 4 shows one embodiment of a complete on-board BPTD preamplifier. In this embodiment one or both of the dual pickups of a guitar are switched into the input of the preamplifier. This circuit uses zero negative feedback through its two vacuum tube stages. Power is provided to the circuit when a ¼ inch phone plug is inserted into the ¼ inch phone jack, by means of a switch. Control of preamp drive, bass, treble, and master volume are available through the potentiometers. Microphonic noise is not an issue in the prototype even with aggressive playing. All standard circuit shielding and grounding techniques are assumed.

Figure 5:
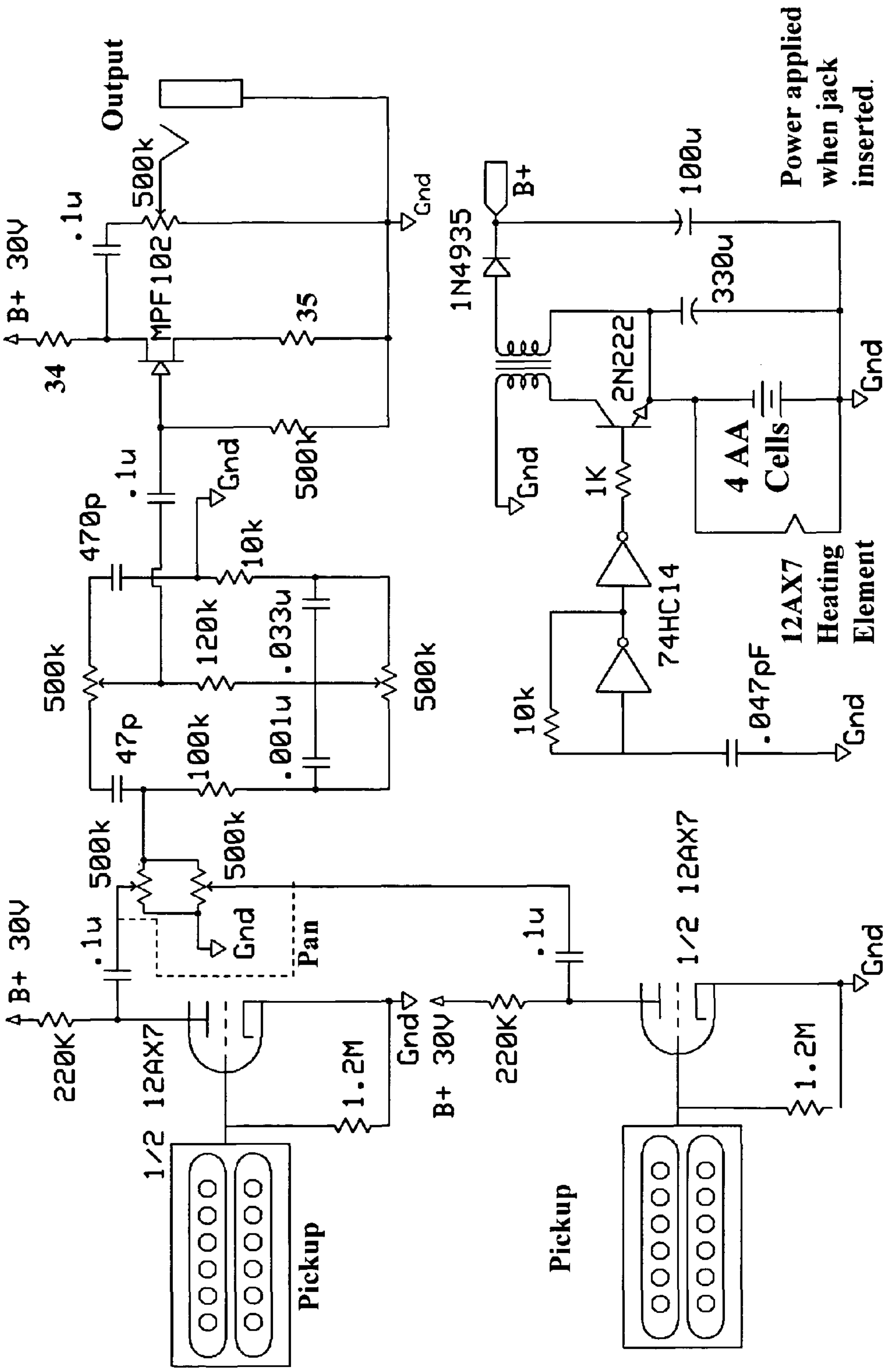
FIG. 5 is an electrical schematic diagram of another embodiment of the invention for a two pickup electric bass guitar, wherein each pickup is amplified by ½ of the 12AX7 tube. A signal panning potentiometer (PAN) pot selects the amount of each pickup.

FIG. 5 shows another embodiment of this invention. In this embodiment each pickup drives one stage of tube amplification. A panning control effectively mixes the amount of signal from each pickup for input into the tone stage. Finally a self-biasing common source JFET stage is used for another stage of amplification. The gain and operating point of the JFET stage is set by resistor 34 and resistor 35 and is a common circuit technique. Controls for this embodiment include panning, bass, treble, and volume. Power is provided to the circuit when a ¼ inch phone plug is inserted into the ¼ inch phone jack, by means of a switch. Microphonic noise is not an issue in the prototype even with aggressive playing. All standard circuit shielding and grounding techniques are assumed. Other embodiments of this invention could pan between a tube input stage and a JFET input stage for each pickup allowing a variety of tonal characteristics.

Figure 6:
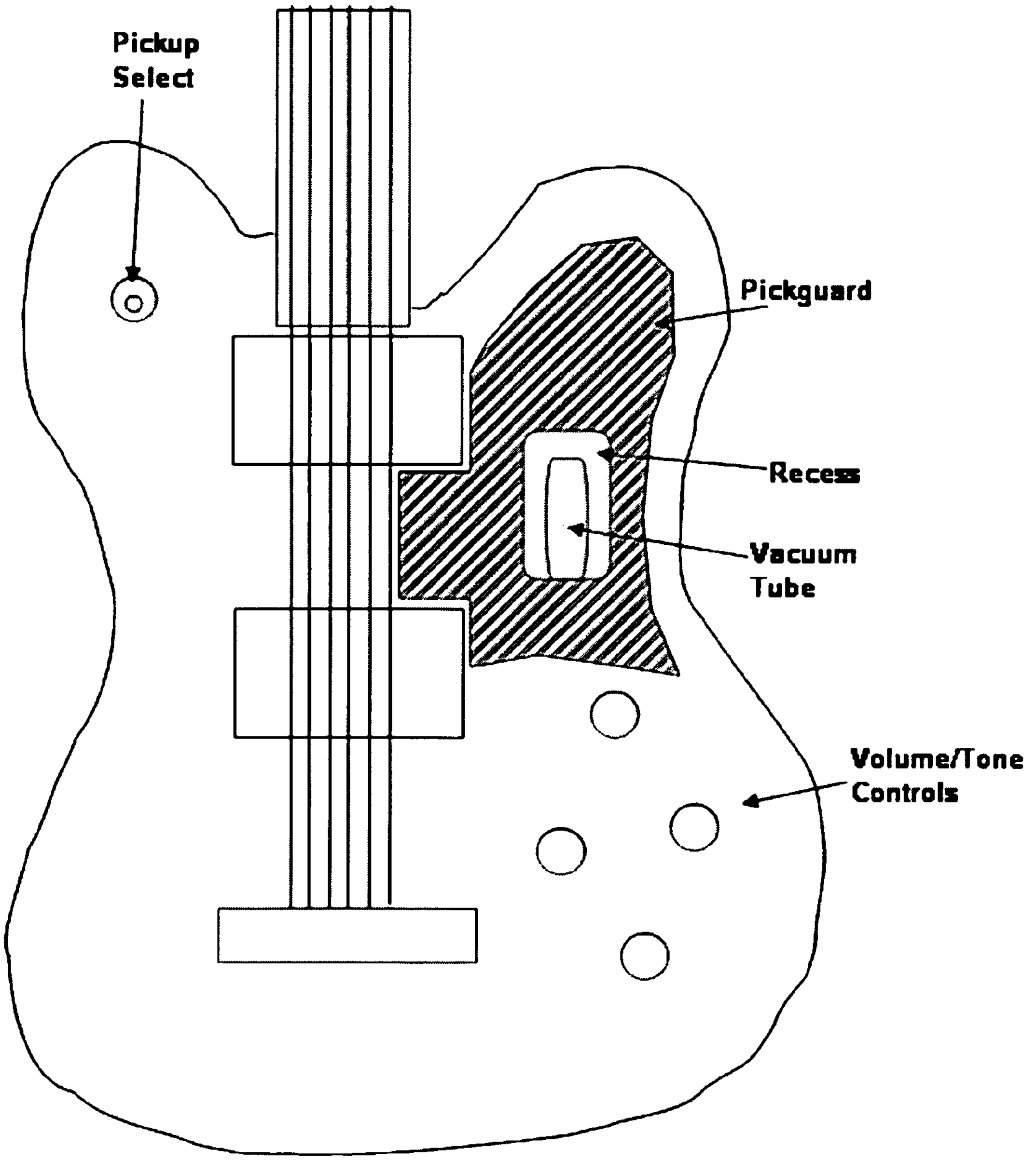
FIG. 6 shows one embodiment of vacuum tube placement on an electric guitar, wherein the portion of the pick-guard passing over the tube is transparent.

FIG. 6 shows a sketch of one embodiment of placement of the vacuum tube on an electric guitar. In this case the tube is placed in a recessed cavity on the body of the guitar. Other embodiments might place it in a hole through the body or in a control cavity or other cavity of the instrument. In this embodiment the tube and recessed cavity are covered by a pick-guard, a standard part of an electric guitar. In this embodiment, the pick-guard is transparent in the area over the tube. In other embodiments, the tube need not be covered, or it may be covered by a screen, cover, or shield which may be opaque, translucent or transparent.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A musical instrument preamplifier, comprising:

a. at least one vacuum tube having at least one grid, one plate, one cathode, and a means for heating said cathode;
b. circuit components for biasing said vacuum tube as an amplification device;
c. circuit components for coupling said vacuum tube to the musical instrument's sensor or pick-up;
d. circuit components for DC blocking/AC coupling to produce an output signal;
e. a simple power source to bias the preamplifier circuit;
f. and utilizing a voltage divider to bias the cathode heater;
g. whereby said components are contained within or attached to the body of the musical instrument.

* * * * *